United States Patent
Hamann et al.

(10) Patent No.: US 9,460,962 B1
(45) Date of Patent: Oct. 4, 2016

(54) SUBSTRATE CONTACT ETCH PROCESS

(71) Applicant: Texas Instruments Incorporated, Dallas, TX (US)

(72) Inventors: David William Hamann, Oconomowoc, WI (US); Thomas E. Lillibridge, Plano, TX (US); Abbas Ali, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/820,542

(22) Filed: Aug. 6, 2015

(51) Int. Cl.
*H01L 21/311* (2006.01)
*H01L 21/768* (2006.01)
*H01L 23/535* (2006.01)

(52) U.S. Cl.
CPC ....... *H01L 21/76895* (2013.01); *H01L 23/535* (2013.01)

(58) Field of Classification Search
CPC ........... H01L 21/762; H01L 21/76205; H01L 21/76224; H01L 21/76229
See application file for complete search history.

(56) References Cited

U.S. PATENT DOCUMENTS

2006/0051931 A1* 3/2006 Wellhausen ........ H01L 27/1087
438/424

OTHER PUBLICATIONS

U.S. Appl. No. 14/555,359, filed Nov. 26, 2014.

* cited by examiner

*Primary Examiner* — Hoai V Pham
(74) *Attorney, Agent, or Firm* — Jacqueline J. Garner; Frank D. Cimino

(57) ABSTRACT

A semiconductor device with a deep trench has a dielectric liner formed on sidewalls and a bottom of the deep trench. A pre-etch deposition step of a two-step process forms a protective polymer on an existing top surface of the semiconductor device, and on the dielectric liner proximate to a top surface of the substrate. The pre-etch deposition step does not remove a significant amount of the dielectric liner from the bottom of the deep trench. A main etch step of the two-step process removes the dielectric liner at the bottom of the deep trench while maintaining the protective polymer at the top of the deep trench. The protective polymer is subsequently removed.

16 Claims, 5 Drawing Sheets

US 9,460,962 B1

SUBSTRATE CONTACT ETCH PROCESS

FIELD OF THE INVENTION

This invention relates to the field of semiconductor devices. More particularly, this invention relates to deep trench contacts in semiconductor devices.

BACKGROUND OF THE INVENTION

A semiconductor device has a deep trench at least 10 microns deep, with a silicon dioxide liner on sidewalls and bottom of the deep trench. It is desirable to remove the silicon dioxide liner at the bottom of the trench without substantially reducing the silicon dioxide liner on the sidewalls of the deep trench, in order to make a contact to the substrate. A reactive ion etch (RIE) process used to remove the silicon dioxide liner at the bottom of the trench to make contact to the substrate has high ion energies which also remove dielectric material from the liner at the top of the deep trench, which undesirably widens a top portion of the deep trench. Widening the top portion necessitates a thicker layer of deposited silicon dioxide in the liner, which disadvantageously increases fabrication cost.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device is formed by etching a deep trench at least 10 microns deep in a substrate. A dielectric liner is formed on sidewalls and a bottom of the deep trench. A two-step process is used to remove the dielectric liner at the bottom of the deep trench. A pre-etch deposition step of the two-step process forms a protective polymer on an existing top surface of the semiconductor device, and on the dielectric liner proximate to a top surface of the substrate. The pre-etch deposition step does not remove a significant amount of the dielectric liner from the bottom of the deep trench. A main etch step of the two-step process removes the dielectric liner at the bottom of the deep trench while maintaining the protective polymer at the top of the deep trench. The protective polymer is subsequently removed.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
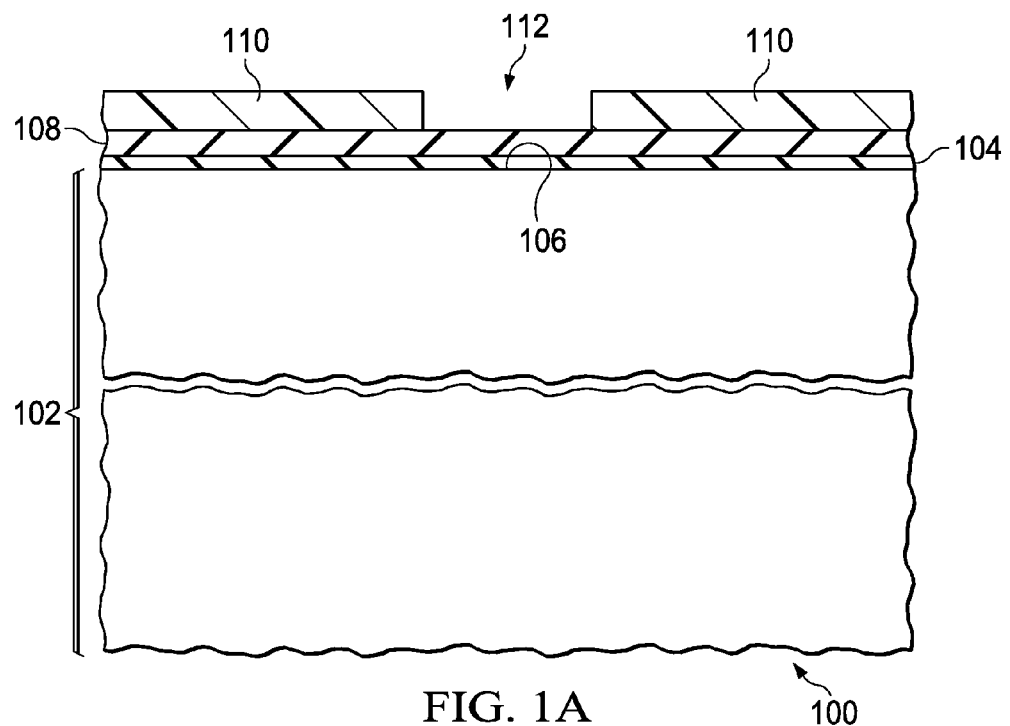
FIG. 1A through FIG. 1I are cross sections of a semiconductor device, depicted in successive stages of an example fabrication sequence.

FIG. 1A through FIG. 1I are cross sections of a semiconductor device, depicted in successive stages of an example fabrication sequence. Referring to FIG. 1A, the semiconductor device 100 is formed in a substrate 102 such as a silicon wafer or a wafer of another semiconductor material. Other forms of the substrate 102, such as an epitaxial layer of semiconductor material, are within the scope of the instant example. In FIG. 1A through FIG. 1I, the substrate 102 is divided to show details of a subsequently-formed deep trench more clearly at both a top portion of the deep trench and at a bottom portion of the deep trench. A pad layer 104 is formed over a top surface 106 of the substrate 102. The pad layer 104 may include, for example, a layer of thermal oxide at the top surface 106 and a layer of silicon nitride, formed by a low pressure chemical vapor deposition (LPCVD) process, on the layer of thermal oxide. A layer of hard mask oxide 108 is formed over the pad layer 104. The layer of hard mask oxide 108 may be, for example, 1 micron to 2 microns thick, depending on a depth of the subsequently-formed deep trench. The layer of hard mask oxide 108 may be formed by a plasma enhanced chemical vapor deposition (PECVD) process using tetraethyl orthosilicate (TEOS), also referred to as tetraethoxysilane, or by using a high density plasma (HDP) process. A trench mask 110 is formed over the layer of hard mask oxide 108 so as to expose an area for the deep trench 112. The trench mask 110 includes photoresist formed by a photolithographic process, and may include an anti-reflection layer such as an organic bottom anti-reflection coat (BARC) and/or a hard mask layer of silicon nitride.

Figure 1B:
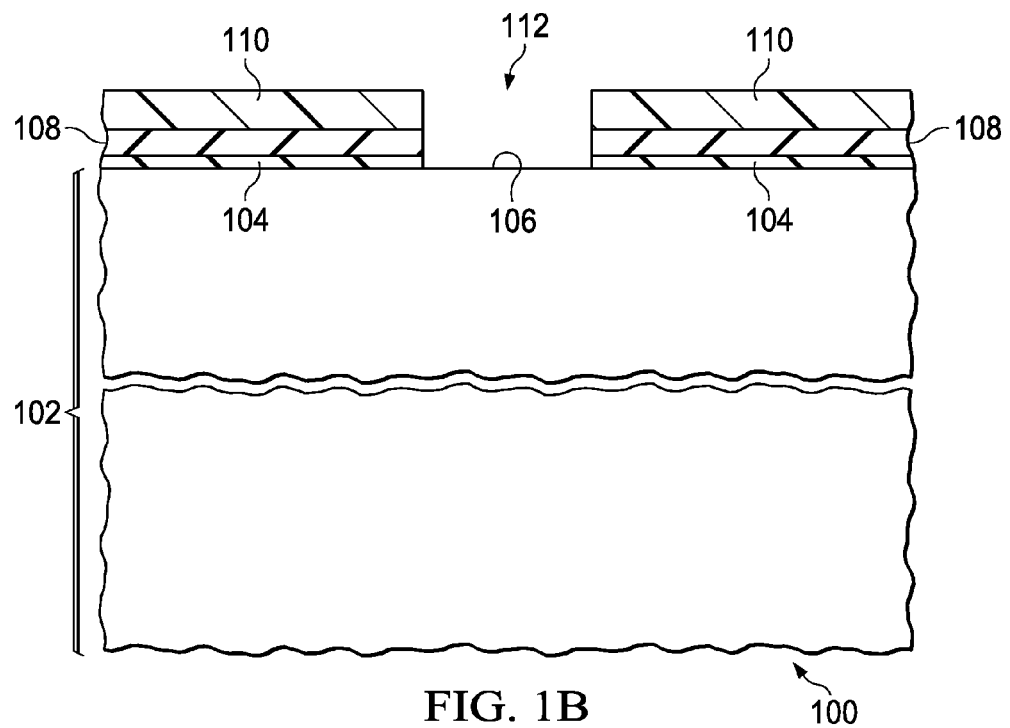

Referring to FIG. 1B, the layer of hard mask oxide 108 and the pad layer 104 are removed in the area for the deep trench 112 exposed by the trench mask 110. The layer of hard mask oxide 108 may be removed by an RIE process. The pad layer 104 is subsequently removed, for example by the same RIE process or by another RIE process. The trench mask 110 may optionally be removed or left in place at this time.

Figure 1C:
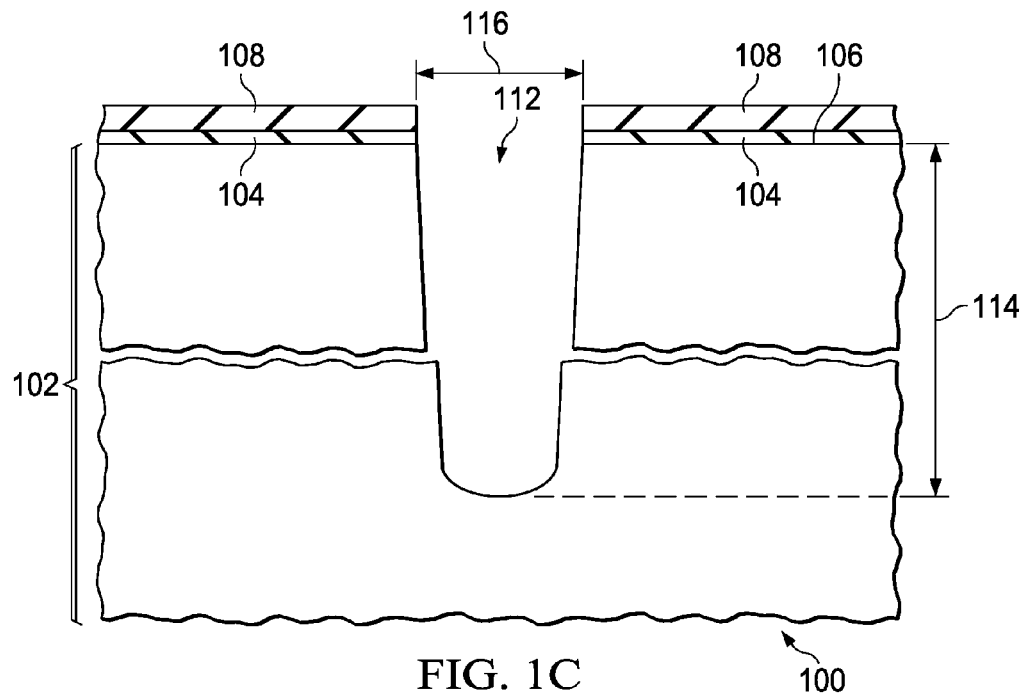

Referring to FIG. 1C, the deep trench 112 is formed by removing material from the substrate 102 using the patterned layer of hard mask oxide 108 as an etch mask. The deep trench 112 is formed by a timed RIE process. The deep trench 112 has a depth 114 of at least 10 microns; the depth 114 may be 25 microns to 40 microns. The deep trench 112 has a width 116 of 0.5 microns to 3 microns. Any remaining portion of the trench mask 110 of FIG. 1B is removed by the RIE process to form the deep trench 112. The deep trench 112 may be slightly tapered, as depicted in FIG. 1C.

Figure 1D:
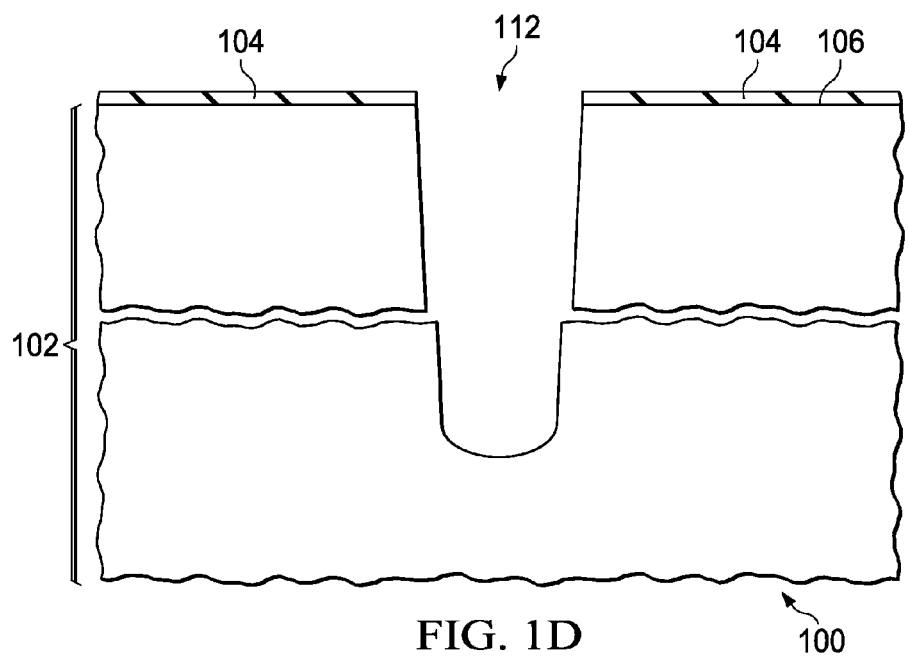

Referring to FIG. 1D, the layer of hard mask oxide 108 of FIG. 1C may optionally be removed after the deep trench 112 is formed, as depicted in FIG. 1D. Alternatively, the layer of hard mask oxide 108 may be left in place during subsequent fabrication steps.

Figure 1E:
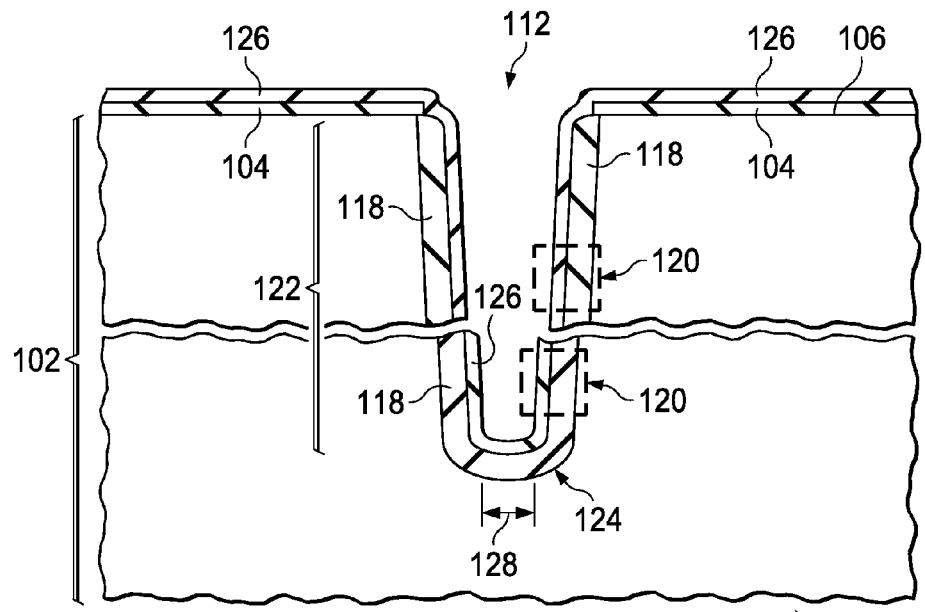

Referring to FIG. 1E, a layer of thermal oxide 118 of a dielectric liner (120) is formed on sidewalls 122 and a bottom 124 of the deep trench 112. The layer of thermal oxide 118 may be, for example, 200 nanometers to 300 nanometers thick. A layer of silicon dioxide 126 of the dielectric liner 120 is formed on the layer of thermal oxide 118, for example by a sub-atmospheric chemical vapor deposition (SACVD) process. The layer of silicon dioxide 126 may be, for example, 300 nanometers to 700 nanometers thick. The layer of thermal oxide 118 combined with the layer of silicon dioxide 126 provide the dielectric liner 120. The dielectric liner 120 covers the bottom 124 of the deep trench 112 and has a space 128 of at least 300 nanometers proximate to the bottom 124, so that a thickness of the dielectric liner 120 at the bottom 124 is not more than a thickness of the dielectric liner 120 on the sidewalls 122.

A total thickness of the dielectric liner 120 may be, for example, 500 nanometers to 1 micron, and is selected to provide a desired breakdown strength for operation of the semiconductor device at a particular voltage. In another version of the instant example, the relative thicknesses of the layer of thermal oxide 118 and the layer of silicon dioxide 126 may be varied to provide desired process latitude. In an alternative version of the instant example, the dielectric liner 120 may consist of the layer of thermal oxide 118 alone, without the layer of silicon dioxide 126.

Figure 1F:
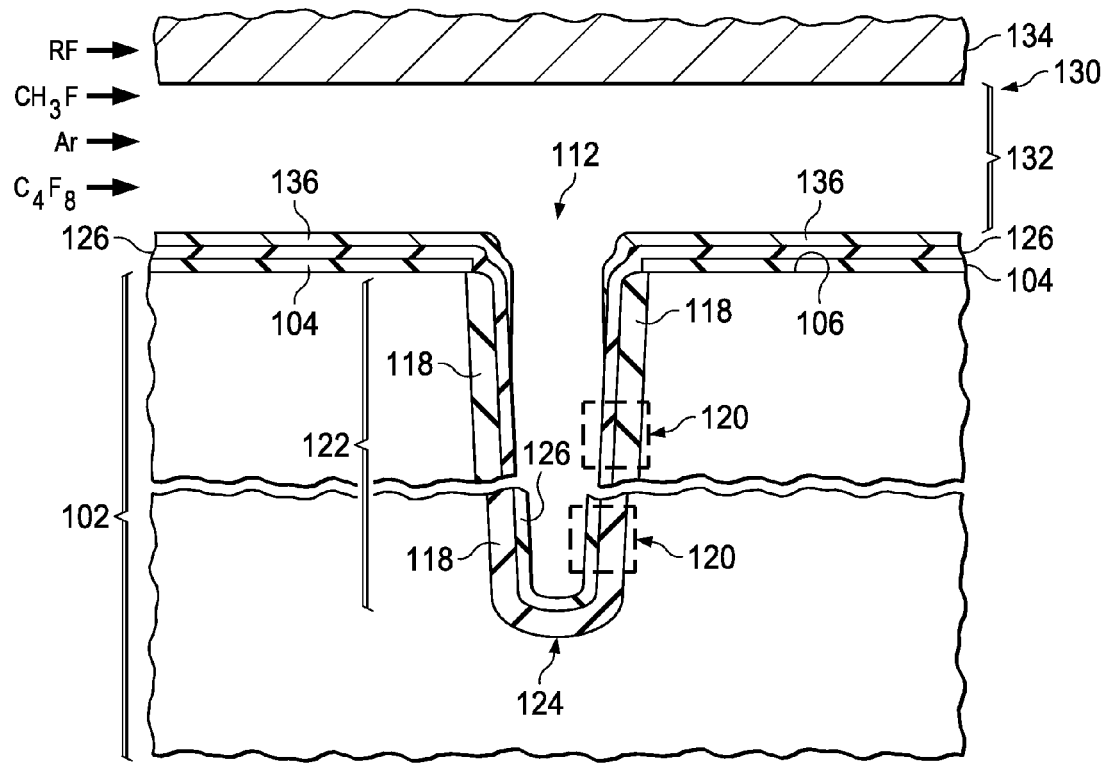

Referring to FIG. 1F, a preetch deposition process of a two step process is performed to form a protective polymer 136 on an existing top surface of the semiconductor device 100 over the top surface 106 of the substrate 102, extending onto the dielectric liner 120 in the deep trench 112 proximate to the top surface 106 of the substrate 102. The protective polymer 136 may be, for example, 10 nanometers to 50 nanometers thick over the top surface of the semiconductor device 100 adjacent to the deep trench 112. Substantially no polymer is formed on the dielectric liner 120 at the bottom 124 of the deep trench 112. Substantially no dielectric material is removed from the dielectric liner 120 during the pre etch deposition process. One method for forming the protective polymer 136 will now be described. The semiconductor device 100 is placed in a first chamber 130, for example an etch chamber of a wafer processing tool. A substrate chuck, not shown, supporting the substrate 102 may be held at a temperature of 0° C. to 35° C. A carrier gas such as argon is flowed into a first plasma region 132 of the first chamber 130 over the semiconductor device 100 at a rate of 125 standard cubic centimeters per minute (sccm) to 1500 sccm. A fluorinated hydrocarbon with a fluorine-to-carbon atomic ratio of at least 2 to 1, for example a perfluorinated hydrocarbon such as octafluorocyclobutane ($C_4F_8$) as depicted in FIG. 1F, is flowed into the first plasma region 132 at a rate of 10 sccm to 50 sccm with the carrier gas. Fluoromethane ($CH_3F$) is flowed into the first plasma region 132 at a rate of 20 sccm to 80 sccm, with the fluorinated hydrocarbon. A pressure in the first plasma region 132 is maintained at 35 millitorr to 65 millitorr. Radio frequency (RF) power is applied to an electrode 134 over the first plasma region 132 at an average power level of 0.5 watts to 1 watt per square centimeter of the substrate 102, causing a plasma to be formed in the first plasma region 132. The plasma causes the fluorinated hydrocarbon and the fluoromethane to react to form the protective polymer 136 on the existing top surface of the semiconductor device 100, extending onto the dielectric liner 120 in the deep trench 112 proximate to the top surface 106 of the substrate 102. Substantially no polymer is formed on the dielectric liner 120 at the bottom 124 of the deep trench 112. Substantially no dielectric material is removed from the dielectric liner 120 during the pre-etch deposition process. In another version of the instant example, the fluorinated hydrocarbon may be hexafluorocyclobutane ($C_4F_6$), octafluorocyclopentane ($C_5F_8$), perfluorocyclohexane ($C_6F_{12}$), perfluoropropane ($C_3F_8$), perfluoroethane ($C_2F_6$) or tetrafluoromethane ($CF_4$).

Figure 1G:
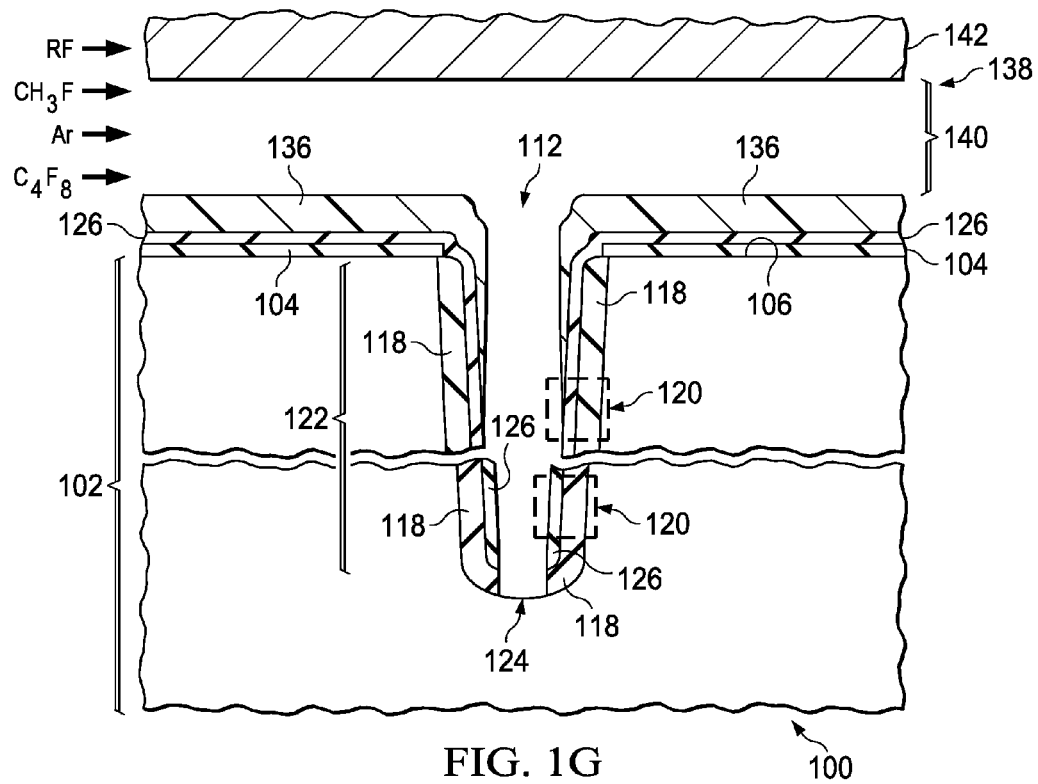

Referring to FIG. 1G, a main etch process of the two-step process is performed to remove the dielectric liner 120 at the bottom 124 of the deep trench 112. The main etch process causes no substantial degradation of the dielectric liner 120 on the sidewalls 122 of the deep trench 112. Concurrently, the main etch process reacts the fluorinated hydrocarbon and the fluoromethane to maintain and possibly increase the protective polymer 136. The protective polymer 136 may increase in thickness, for example, by 100 nanometers to 500 nanometers on the top surface of the semiconductor device 100 adjacent to the deep trench 112. The protective polymer 136 advantageously prevents removal of dielectric material from the dielectric liner 120 during the main etch process. An example method of performing the main etch process will now be described. The semiconductor device 100 is placed in a second chamber 138, which may be the first chamber 130 of FIG. 1F. A substrate chuck, not shown, supporting the substrate 102 may be held at a temperature of 0° C. to 35° C. A carrier gas such as argon is flowed into a second plasma region 140 of the second chamber 138 over the semiconductor device 100 at a rate of 125 sccm to 1500 sccm. A fluorinated hydrocarbon with a fluorine-to-carbon atomic ratio of at least 2 to 1, designated as $C_4F_8$ in FIG. 1G, is flowed into the second plasma region 140 at a rate of 20 sccm to 80 sccm with the carrier gas. Fluoromethane is flowed into the second plasma region 140 at a rate of 5 sccm to 40 sccm with the fluorinated hydrocarbon. A pressure in the second plasma region 140 is maintained at 20 millitorr to 30 millitorr. RF power is applied to an electrode 142 over the second plasma region 140 at an average power level of 3 watts to 5 watts per square centimeter of the substrate 102, causing a plasma to be formed in the second plasma region 140. The plasma generates fluorine radicals which remove the dielectric liner 120 at the bottom 124 of the deep trench 112.

The sidewalls 122 are substantially straight up to the top surface 106 of the substrate 102, and not flared, enabling the deep trench 112 to be located closer to components of the semiconductor device 100 and thus advantageously reducing a size of the semiconductor device 100. The dielectric liner 120 has a substantially uniform thickness up to the top surface 106 of the substrate 102, advantageously enabling a thinner layer of silicon dioxide 126, advantageously reducing a fabrication cost of the semiconductor device 100. In one version of the instant example, the pre-etch deposition process and the main etch process may be performed in the same chamber 130 and 138, the RF power may be continued from the pre-etch deposition process to the main etch process, and flows of the fluorinated hydrocarbon and the fluoromethane may be continued and adjusted from the pre-etch deposition process to the main etch process, so that a plasma is advantageously maintained from the pre-etch deposition process to the main etch process, eliminating the need to strike a plasma at the low pressure of the main etch process.

Figure 1H:
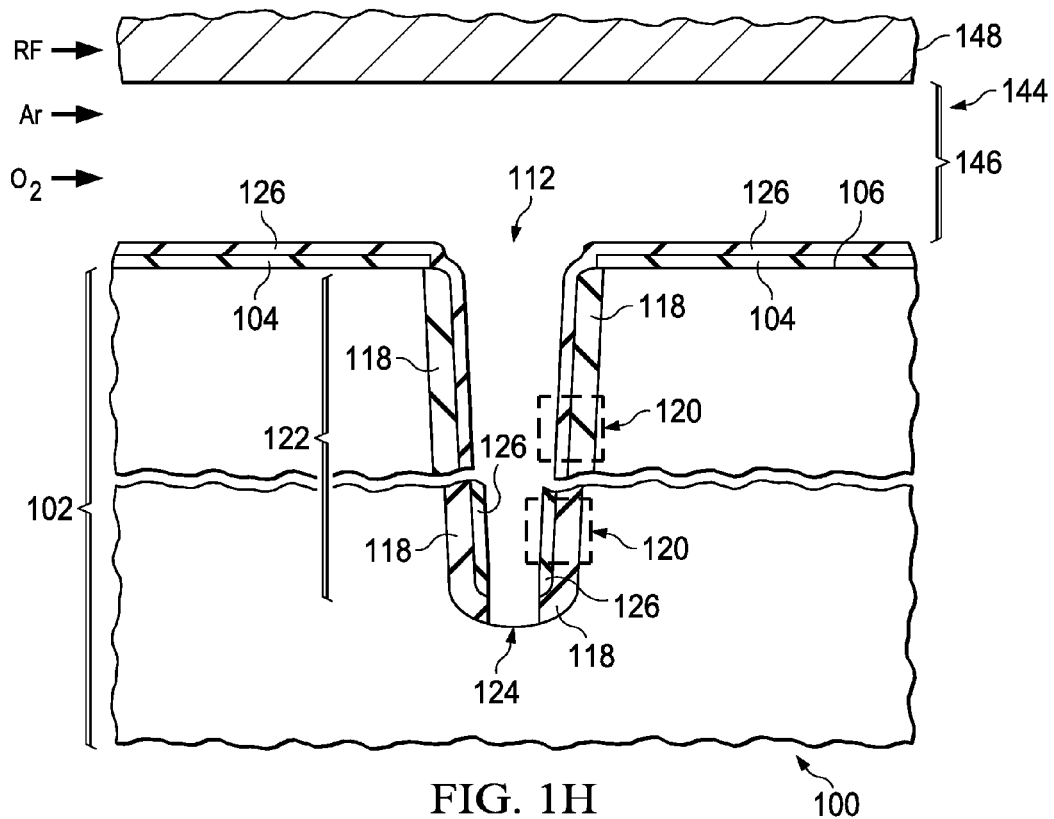

Referring to FIG. 1H, an ash process is performed to remove the protective polymer 136 of FIG. 1G. The ash process causes no substantial degradation of the dielectric liner 120 on the sidewalls 122 of the deep trench 112. An example ash process will now be described. The semiconductor device 100 is placed in a third chamber 144, which may be the first chamber 130 of FIG. 1F and/or the second chamber 138 of FIG. 1G. A carrier gas such as argon is flowed into a plasma region 146 of the second chamber 138 at a rate of 500 sccm to 1000 sccm. Oxygen gas is flowed into the plasma region 146 at a rate of 125 sccm to 500 sccm. A pressure in the plasma region 146 is maintained at 150 millitorr to 300 millitorr. RF power is applied to an electrode 148 over the plasma region 146 at an average power level of 0.5 watts to 1 watt per square centimeter of the substrate 102, causing a plasma to be formed in the plasma region 146. The plasma generates oxygen radicals which remove the protective polymer 136 of FIG. 1G. In one version of the instant example, the ash process may be performed in the same chamber 138 as the main etch process, so that polymer deposited on surface of the chamber 138 during the main etch process is advantageously removed during the ash process, preventing buildup of polymer, and desirably increasing consistency of the main etch process.

Figure 1I:
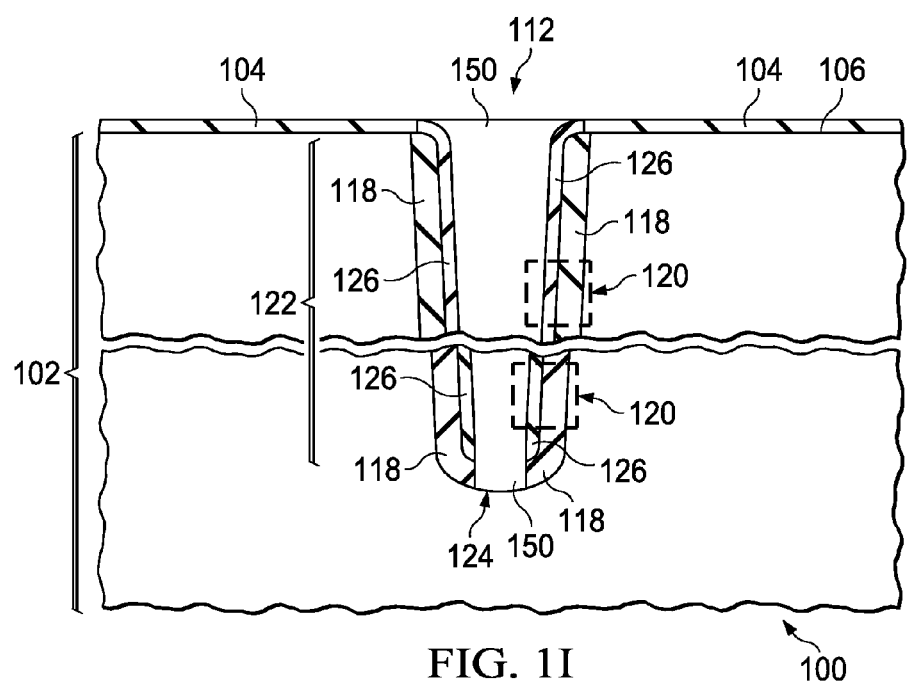

Referring to FIG. 1I, an electrically conductive trench fill 150 is formed in the deep trench 112, contacting the substrate 102 at the bottom 124. The trench fill 150 may include, for example, polycrystalline silicon, referred to as polysilicon, doped to have a same conductivity type as the substrate 102 at the bottom 124 of the deep trench 112. The trench fill 150 may be formed by forming one or more layers of polysilicon over an existing top surface of the semiconductor device 100, extending into the deep trench 112 and contacting the substrate 102 at the bottom 124. The polysilicon may be doped during formation of the layers, or may be doped by ion implantation. Polysilicon over the top surface 106 of the substrate 102 is subsequently removed, for example by a chemical mechanical polish (CMP) process and/or an etchback process.

Figure 2:
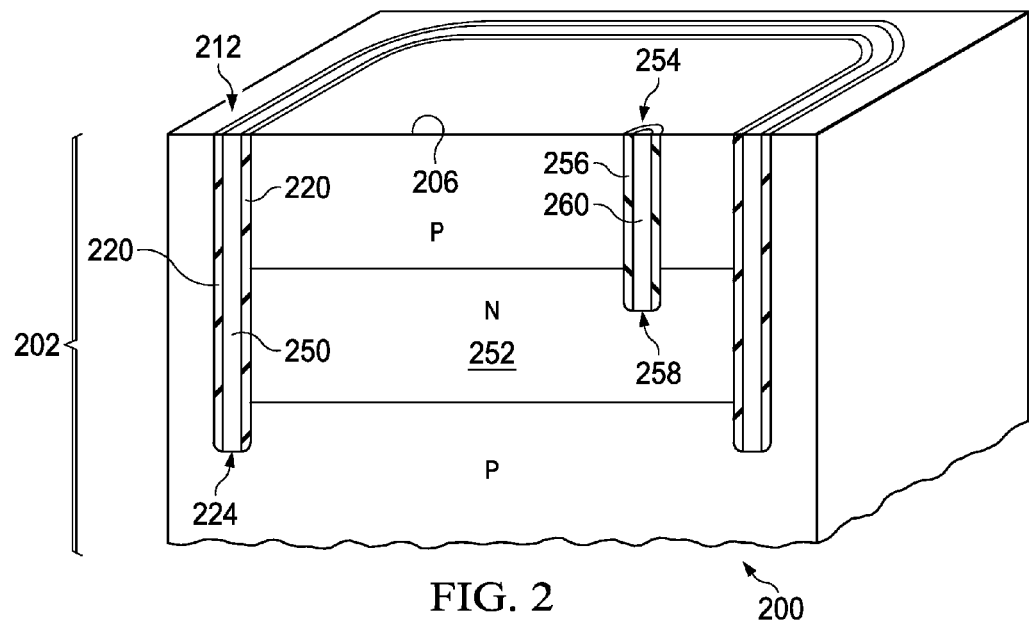
FIG. 2 is a cross section of an example semiconductor device.

FIG. 2 is a cross section of an example semiconductor device. The semiconductor device 200 is formed in a substrate 202 as described in reference to FIG. 1A. In the instant example, the substrate 202 includes an n-type buried layer 252; semiconductor material in the substrate 202 above, below and surrounding the n-type buried layer 252 is p-type.

A first deep trench 212, which is at least 10 microns deep, has a closed-loop configuration and surrounds and abuts the n-type buried layer 252. The first deep trench 212 has a first dielectric liner 220 abutting the substrate 202 and extending from proximate to a top surface 206 of the substrate 202 to proximate to a bottom 224 of the first deep trench 212. At least a portion of the bottom 224 of the first deep trench 212 is free of the first dielectric liner 220. A first trench fill 250 of p-type polysilicon is disposed in the first deep trench 212, extending to the bottom 224 and making contact to the p-type semiconductor material of the substrate 202. Sidewalls of the first deep trench 212 are substantially straight up to the top surface 206 of the substrate 202, accruing the advantages described in reference to FIG. 1G.

The semiconductor device 200 includes a second deep trench 254 which extends to the n-type buried layer 252. The second deep trench 254 is at least 10 microns deep and has a lateral aspect ratio less than 2, that is, a ratio of a lateral length to a lateral width is less than 2. The second deep trench 254 has a second dielectric liner 256 abutting the substrate 202 and extending from proximate to the top surface 206 of the substrate 202 to a bottom 258 of the second deep trench 254. At least a portion of the bottom 258 of the second deep trench 254 is free of the first dielectric liner 220. A second trench fill 260 of n-type polysilicon is disposed in the second deep trench 254, extending to the bottom 258 and making contact to the n-type semiconductor material of the n-type buried layer 252. Sidewalls of the second deep trench 254 are substantially straight up to the top surface 206 of the substrate 202, accruing the advantages described in reference to FIG. 1G.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:
   providing a substrate;
   forming a deep trench at least 10 microns deep and 0.5 microns to 3 microns wide in the substrate;
   forming a dielectric liner on sidewalls and a bottom of the deep trench;
   forming a protective polymer over a top of the substrate by a pre-etch deposition plasma process, the protective polymer extending onto the dielectric liner in the deep trench proximate to the top surface of the substrate, but not on the dielectric liner at the bottom of the deep trench, while concurrently removing substantially no dielectric material from the dielectric liner;
   removing the dielectric liner at the bottom of the deep trench by a main etch plasma process, while concurrently removing no polymer material from the protective polymer on the dielectric liner in the deep trench proximate to the top surface of the substrate and removing no dielectric material from the dielectric liner in the deep trench proximate to the top surface of the substrate; and
   subsequently removing the protective polymer.

2. The method of claim 1, wherein the dielectric liner comprises primarily silicon dioxide.

3. The method of claim 2, wherein the dielectric liner is thermal oxide.

4. The method of claim 1, wherein the dielectric liner is 500 nanometers to 1 micron thick.

5. The method of claim 1, wherein the pre-etch deposition plasma process comprises:
   placing the semiconductor device in a first chamber, the first chamber having a first plasma region over the semiconductor device;
   flowing a carrier gas into the first plasma region;
   flowing a fluorinated hydrocarbon with a fluorine-to-carbon atomic ratio of at least 2 to 1, into the first plasma region;
   flowing fluoromethane into the first plasma region;
   maintaining a pressure in the first plasma region at 35 millitorr to 65 millitorr; and
   applying radio frequency (RF) power to an electrode over the first plasma region, causing a first plasma to be formed in the first plasma region.

6. The method of claim 5, wherein the fluorinated hydrocarbon is octafluorocyclobutane.

7. The method of claim 1, wherein the protective polymer formed by the pre-etch deposition plasma process over the top of the substrate adjacent to the deep trench is 10 nanometers to 50 nanometers thick.

8. The method of claim 1, wherein the main etch plasma process comprises:

placing the semiconductor device in a second chamber, the second chamber having a second plasma region over the semiconductor device;

flowing a carrier gas into the second plasma region;

flowing a fluorinated hydrocarbon with a fluorine-to-carbon atomic ratio of at least 2 to 1, into the second plasma region;

flowing fluoromethane into the second plasma region;

maintaining a pressure in the plasma region at 20 millitorr to 30 millitorr; and applying RF power to an electrode over the plasma region, causing a plasma to be formed in the second plasma region.

9. The method of claim 8, wherein the fluorinated hydrocarbon is octafluorocyclobutane.

10. The method of claim 1, wherein the main etch plasma process increases a thickness of the protective polymer.

11. The method of claim 10, wherein the main etch plasma process adds 100 nanometers to 500 nanometers to the thickness of the protective polymer over the top of the substrate adjacent to the deep trench.

12. The method of claim 1, wherein the pre-etch deposition plasma process and the main etch plasma process are performed in a same chamber.

13. The method of claim 12, wherein RF power is maintained during a transition between the pre-etch deposition plasma process and the main etch plasma process so as to maintain a plasma over the semiconductor device during the transition.

14. The method of claim 1, wherein removing the protective polymer comprises an ash process.

15. The method of claim 14, wherein the ash process and the main etch plasma process are performed in a same chamber.

16. The method of claim 1, wherein the deep trench is 25 microns to 40 microns deep.

* * * * *